(12) United States Patent
Endo

(10) Patent No.: US 11,385,286 B2
(45) Date of Patent: Jul. 12, 2022

(54) METHOD FOR CONTROLLING TEST APPARATUS AND TEST APPARATUS

(71) Applicant: Tokyo Electron Limited, Tokyo (JP)

(72) Inventor: Tomoya Endo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/018,128

(22) Filed: Sep. 11, 2020

(65) Prior Publication Data

US 2021/0088588 A1  Mar. 25, 2021

(30) Foreign Application Priority Data

Sep. 24, 2019 (JP) .............................. JP2019-173443

(51) Int. Cl.
*G01R 31/26* (2020.01)
*G01R 31/28* (2006.01)
*G01R 1/04* (2006.01)
*G01R 1/067* (2006.01)
*G01R 1/073* (2006.01)
*G01R 31/3185* (2006.01)

(52) U.S. Cl.
CPC .. *G01R 31/318511* (2013.01); *G01R 31/2887* (2013.01)

(58) Field of Classification Search
CPC ........ G01R 31/02; G01R 31/26; G01R 31/28; G01R 31/3185; G01R 31/2877; G01R 31/2831; G01R 31/2862; G01R 31/2881; G01R 31/2893; G01R 1/04; G01R 1/067; G01R 1/073
See application file for complete search history.

(56) References Cited

U.S. PATENT DOCUMENTS

2013/0057839 A1*  3/2013  Mizutani ............... G03F 9/7096
                                                       355/53
2018/0275192 A1*  9/2018  Yamada ............. G01R 31/2891

FOREIGN PATENT DOCUMENTS

JP        2019-029627        2/2019

* cited by examiner

*Primary Examiner* — Neel D Shah
(74) *Attorney, Agent, or Firm* — IPUSA, PLLC

(57) ABSTRACT

A method for controlling a test apparatus, the test apparatus including a test unit in which testers are arranged in columns and rows, each tester configured to test a substrate; aligners each configured to cause the substrate to be contacted with respect to a given tester from among the testers, at least one aligner provided in each row; and a controller configured to control the aligners. The method includes constraining, by the controller, operation of at least a second aligner, while alignment is performed through a first aligner from among the aligners.

7 Claims, 8 Drawing Sheets

METHOD FOR CONTROLLING TEST APPARATUS AND TEST APPARATUS

CROSS-REFERENCE TO RELATED APPLICATION

This patent application claims priority to Japanese Patent Application No. 2019-173443, filed Sep. 24, 2019, the entire contents of which are incorporated herein by reference in their entirety.

TECHNICAL FIELD

The present disclosure relates to a method for controlling a test apparatus and a test apparatus.

BACKGROUND

For test apparatuses, semiconductor devices formed on wafers are mounted on stage apparatuses. In such a test apparatus, testers are known to pass a current to the semiconductor devices via probes or the like to thereby check electrical characteristics of the semiconductor devices. Japanese Unexamined Patent Application No. 2019-029627, which is hereinafter referred to as Patent document 1, discloses a test system having test cells arranged in columns and rows.

SUMMARY

According to one aspect of the present disclosure, a method for controlling a test apparatus and a test apparatus are provided whereby contact accuracy is improved.

According to one aspect of the present disclosure, a method for controlling a test apparatus is provided, the test apparatus including a test unit in which testers are arranged in columns and rows, each tester configured to test a substrate; aligners each configured to cause the substrate to be contacted with respect to a given tester from among the testers, at least one aligner provided in each row; and a controller configured to control the aligners. The method includes constraining, by the controller, operation of at least a second aligner, while alignment is performed through a first aligner from among the aligners.

DETAILED DESCRIPTION

One or more embodiments of the present disclosure will be described with reference to the drawings. In each drawing, the same numerals denote the same components; accordingly, duplicate explanations for the component will not be provided.

[Substrate Test Apparatus]

A substrate test apparatus according to the present embodiment will be described. The substrate test apparatus according to the present embodiment is an apparatus including multiple cells in which semiconductor wafers (hereinafter referred to as "wafers") each of which is a substrate can be independently and simultaneously tested. Note that the substrate test apparatus is not limited to the manner described above. For example, the substrate test apparatus may be an apparatus that tests a single wafer.

Figure 1:
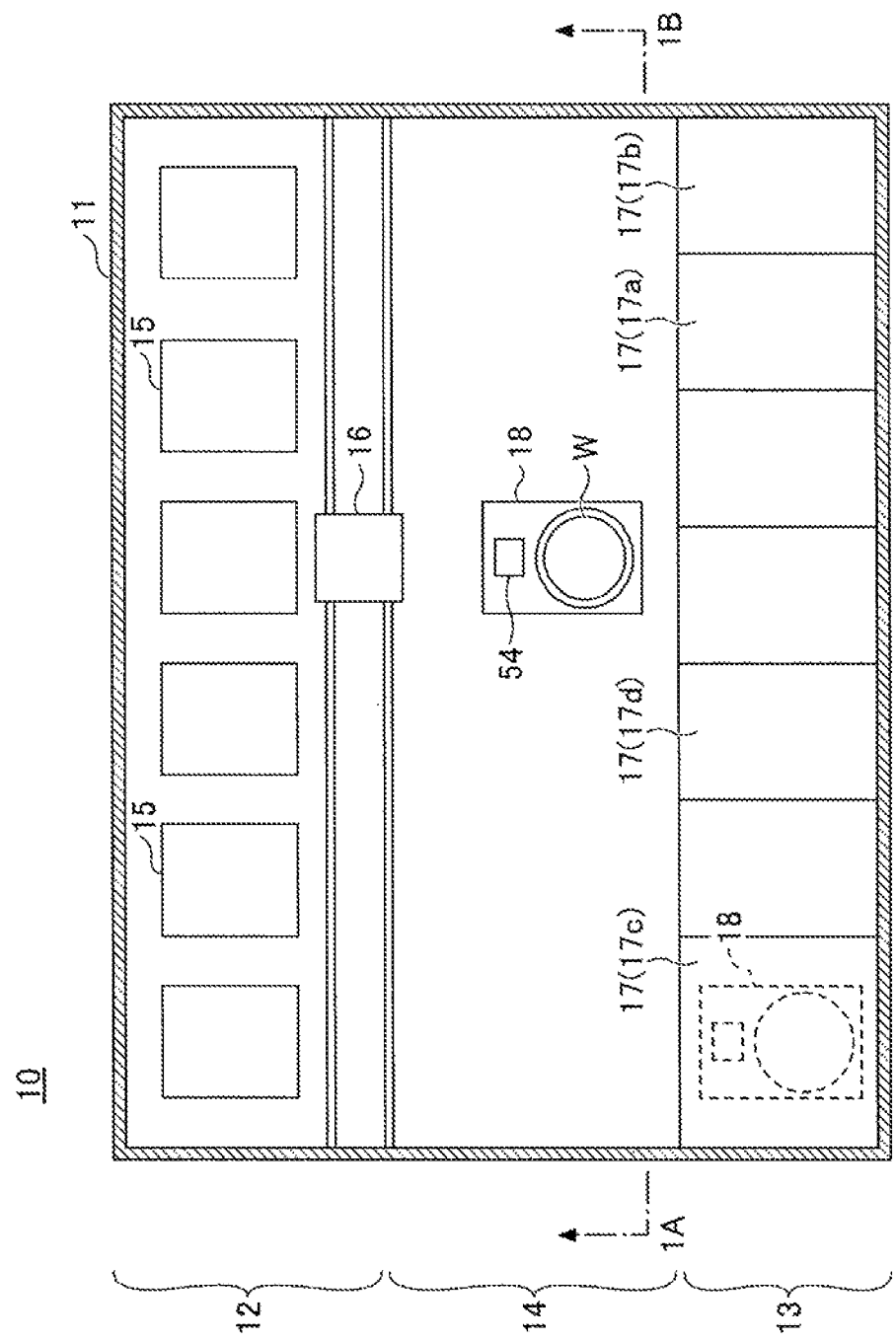
FIG. 1 is a diagram schematically illustrating an example of a substrate test apparatus according to the present embodiment.
Figure 2:
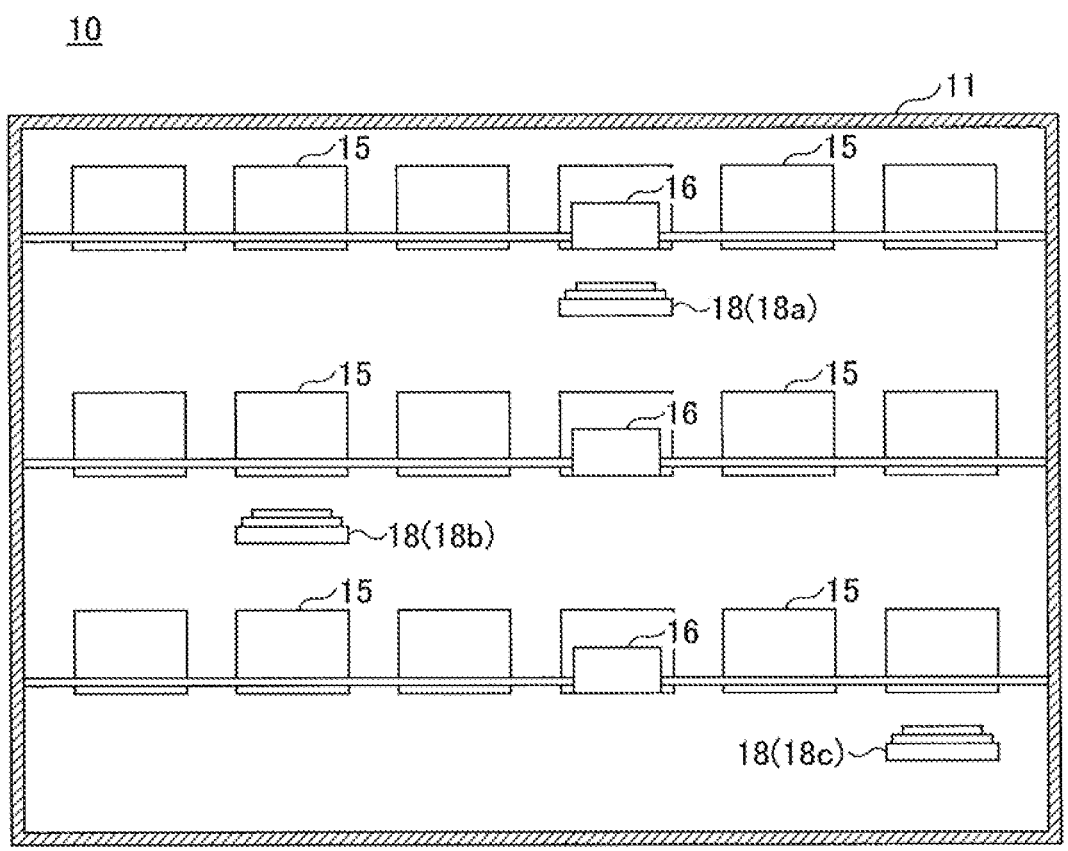
FIG. 2 is a diagram schematically illustrating an example of the substrate test apparatus according to the present embodiment.

FIGS. 1 and 2 are diagrams schematically illustrating an example of the substrate test apparatus according to the present embodiment. FIG. 1 illustrates the horizontal cross section of the substrate test apparatus. FIG. 2 illustrates the cross section taken along the dashed-dotted line 1A-1B in FIG. 1.

As illustrated in FIGS. 1 and 2, the substrate test apparatus 10 includes a test room 11. The test room 11 has a test area 12, a loading and unloading area 13, and a transfer area 14.

The test area 12 is an area where electrical characteristics of each of semiconductor devices formed on the wafer W are checked. In the test area 12, testers 15 each of which is used as an interface for a wafer test are arranged. Specifically, the test area 12 has a structure with tester columns and rows, for example, three rows. For the tester rows, a plurality of testers 15 are arranged horizontally. One tester side camera (upper camera) 16 is disposed corresponding to each row. Each tester side camera 16 moves horizontally along a direction in a corresponding tester row. Each tester side camera 16 is positioned in front of a given tester 15 arranged in a given tester row to thereby check the position of the wafer W, etc. that the transfer stage (aligner) 18 transfers; or a level of the chuck top 50 described below being tilted.

The loading and unloading area 13 is an area where the wafer W is loaded or unloaded in the test room 11. The loading and unloading area 13 is divided into a plurality of storage spaces 17. A port 17a, an aligner 17b, a loader 17c, and a controller 17d are disposed in the respective storage spaces 17. The port 17a receives a front open united pod (FOUP), which is a pod that holds multiple wafers W. The aligner 17b aligns the wafer W. The loader 17c loads or unloads a probe card. The controller 17d controls the operation of each component of the substrate test apparatus 10.

The transfer area 14 is an area provided between the test area 12 and the loading and unloading area 13. In the transfer area 14, transfer stages 18 are disposed, each transfer stage 18 being movable not only in the transfer area 14 but also in the test area 12 or the loading and unloading area 13. The transfer stages 18 are provided such that there is one transfer stage for each row. The transfer stage 18 receives the wafer W from the port 17a in the loading and unloading area 13, and then transfers the wafer to a given tester 15. Further, the transfer stage 18 transfers the wafer W, for which electrical characteristics of the semiconductor devices have been checked, from a given tester 15 to the port 17a. A stage side camera (lower camera) 54 is disposed at each of the transfer stages 18. The stage side camera 54 checks the position of the probe card 19 attached to the lower portion of a pogo frame 20.

In the substrate test apparatus 10, each tester 15 checks the electrical characteristics of the semiconductor devices on the transferred wafer W. In this case, while the transfer stage 18 transfers one wafer W toward one tester 15, the other testers 15 can check the electrical characteristics of the semiconductor devices on the other wafers W. Thereby, test efficiency for the wafer W is improved.

Figure 3:
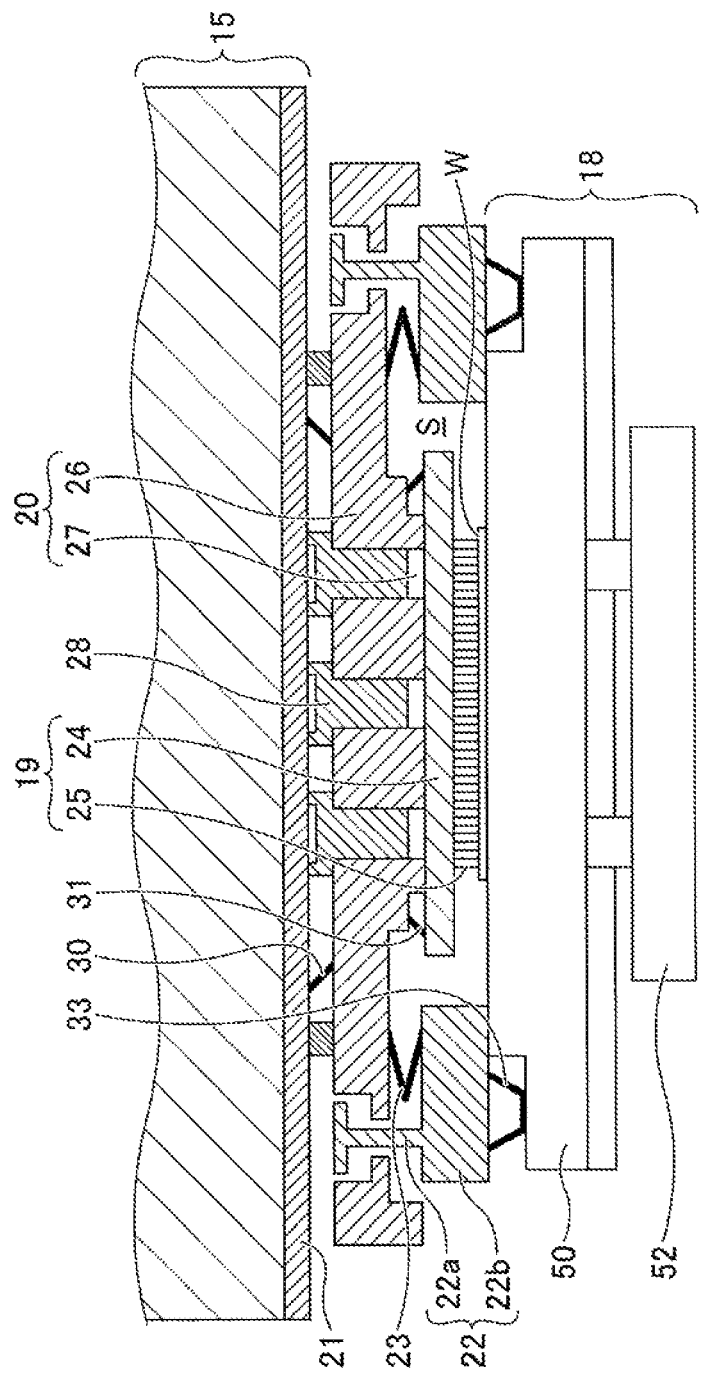
FIG. 3 is a diagram illustrating an example of a tester and a transfer stage of the substrate test apparatus according to the present embodiment.

FIG. 3 is a diagram for explaining an example of the tester 15 and the transfer stage 18 of the substrate test apparatus 10 according to the present embodiment. FIG. 3 illustrates a state in which the transfer stage 18 causes the wafer W to contact the probe card 19 of the tester 15.

As illustrated in FIG. 3, the tester 15 is provided above the pogo frame 20 secured to an apparatus frame (not illustrated). The probe card 19 is attached to the lower portion of the pogo frame 20. A flange 22 capable of moving in a vertical direction with respect to the pogo frame 20 is engaged with the pogo frame 20. A cylindrical bellows 23 is interposed between the pogo frame 20 and the flange 22.

The probe card 19 includes a disk-shaped body 24 and multiple electrodes (not illustrated) disposed approximately on the entire upper surface of the body 24. The probe card 19 includes multiple contact probes 25 (contact terminals) that are disposed so as to protrude downwardly in the figure, from the lower surface of the body 24. The electrodes are connected to the respective contact probes 25. When the wafer W contacts the probe card 19, each contact probe 25 electrically contacts a given electrode pad or a solder bump of a given semiconductor device formed on the wafer W. The multiple contact probes 25 are configured to be able to concurrently contact the entire surface of the wafer W, for example. Thereby, the electrical characteristics of the multiple semiconductor devices can be checked simultaneously. Accordingly, the testing time can be reduced.

The pogo frame 20 includes an approximately flat body 26 and a plurality of pogo-block fitting holes 27 each of which is a through hole drilled proximal to the center of the body 26. Pogo blocks 28 are formed by arranging respective pogo pins and are inserted into the respective pogo-block fitting holes 27. The pogo blocks 28 are connected to test circuitry (not illustrated) provided in the tester 15, and contact the multiple electrodes on the upper surface of the body 24 in the probe card 19 that is attached to the pogo frame 20. With use of the pogo blocks 28, the current flows to the contact probes 25 of the probe card 19 connected to the electrodes. Further, with use of the pogo blocks 28, the current flowing from electrical circuitry of each semiconductor device on the wafer W is passed to the test circuitry, via the contact probes 25.

The flange 22 includes a cylindrical body 22a and a contact portion 22b formed of an annular member that is formed at the lower portion of the body 22a. The flange 22 is disposed to surround the probe card 19. Until the chuck top 50 contacts the flange 22, the flange 22 moves downward according to the weight of the flange 22, such that the lower surface of the contact portion 22b is positioned below tips of the contact probes 25 of the probe card 19.

The bellows 23 has a metallic bellows structure and is stretchable in a vertical direction. A lower end of the bellows 23 closely adheres to the upper surface of the contact portion 22b of the flange 22, and an upper end of the bellows 23 closely adheres to the lower surface of the pogo frame 20.

For the tester 15, a space between the pogo frame 20 and a base 21 is sealed with a sealing member 30. The space is evacuated so that the pogo frame 20 is attached to the base 21. A space between the probe card 19 and the pogo frame 20 is also sealed with a sealing member 31. The space is evacuated so that the probe card 19 is attached to the pogo frame 20.

The transfer stage 18 is an example of a stage apparatus. The transfer stage 18 includes the chuck top 50 that is a thick plate member and includes a bottom plate 52. The chuck top 50 is mounted on the bottom plate 52, and the wafer W is mounted on the upper surface of the chuck top 50. The chuck top 50 is held by vacuum suction to the bottom plate 52, and the wafer W is held by vacuum suction to the chuck top 50. In this case, when the transfer stage 18 moves, the wafer W can be prevented from moving relatively with respect to the transfer stage 18. Note that a method of holding the chuck top 50 or the wafer W is not limited to using vacuum suction. A method that allows the chuck top 50 or the wafer W to be prevented from moving relatively with respect to the bottom plate 52 may be adopted. For example, electromagnetic attraction or clamping may be used for holding. Note that a sealing member 33 is disposed on the outer periphery of the upper surface of the chuck top 50.

The transfer stage 18 is movable. The transfer stage 18 moves below the probe card 19 of the tester 15 so that the wafer W mounted on the chuck top 50 can thereby face the probe card 19. Further, the transfer stage 18 can cause the wafer W to move toward the tester 15. When the chuck top 50 contacts the contact portion 22b of the flange 22, and thus the wafer W contacts the probe card 19, a space S surrounded by the probe card 19; the pogo frame 20; the flange 22; and the chuck top 50 is formed. The space S is sealed with the bellows 23 and the sealing member 33. By evacuating the space S, the chuck top 50 is held by the probe card 19, so that the wafer W mounted on the chuck top 50 contacts the probe card 19. In this case, the electrode pads or the solder bumps in each semiconductor device on the wafer W contact the contact probes 25 of the probe card 19. Note that in the substrate test apparatus 10, the controller 17d controls the movement of each transfer stage 18. The controller 17d identifies the location of each transfer stage 18, as well as a movement amount of the transfer stage 18.

For the substrate test apparatus 10 according to the present embodiment, as test modes in which the wafer W is tested, a normal mode (first operation mode) and a high precision mode (second operation mode) are used. The normal mode is a test mode in which the test throughput for the wafer W is emphasized. The high precision mode is a test mode in which accuracy of contact between the wafer W and the probe card 19 is emphasized. The controller 17d selects the normal mode or the high precision mode, based on a test object, and the wafer W can be tested accordingly.

<Normal Mode>

Figure 4:
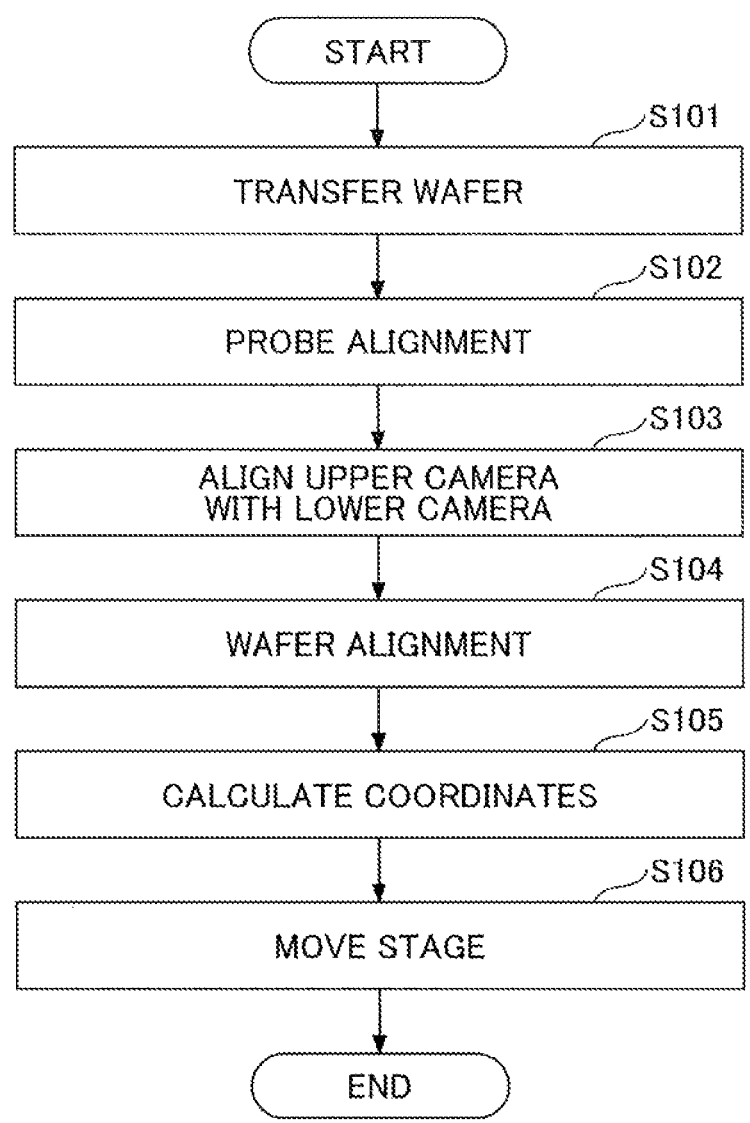
FIG. 4 is a flowchart illustrating an example of the process of contacting a wafer with a probe card.

An example of the operation of the substrate test apparatus 10 in the normal mode will be described with reference to FIG. 4. FIG. 4 is a flowchart illustrating an example of the process of contacting the wafer W with the probe card 19, in the normal mode.

In step S101, the wafer W is transferred. Specifically, the controller 17d causes the transfer stage 18 in which the wafer W is mounted on the chuck top 50, to move.

In step S102, probe alignment is performed. Specifically, the controller 17d causes the stage side camera 54 provided at the transfer stage 18 to be positioned below the probe card 19 to thereby acquire the position of the probe card 19. For example, four markers are formed on the lower surface of the probe card 19. The controller 17d causes the transfer stage 18 to move, the stage side camera 54 images the markers on the probe card 19, and the controller 17d acquires coordinates of the markers based on positions of the imaged markers. Note that when the stage side camera 54 images the markers on the probe card 19, positioning of the transfer stage 18 is first performed in a coarse correction mode, and next the positioning is performed in a fine correction mode. The coarse correction mode is a mode in which the stage side camera 54 is used for macrophotography and the transfer stage 18 is moved. The fine correction mode is a mode in which the stage side camera 54 is used for microphotography and the transfer stage 18 is moved accurately compared to the coarse correction mode.

In step S103, the upper camera is aligned with the lower camera. Specifically, the controller 17d causes the tester side camera 16 to move to a predetermined position. Further, the controller 17d causes the transfer stage 18 to move to thereby align an axis of the tester side camera 16 with an axis of the stage side camera 54. Thereby, a correspondence between coordinates used in the tester side camera 16 and coordinates used in the stage side camera 54 is acquired. Note that when the axis of the tester side camera 16 is aligned with the axis of the stage side camera 54, positioning of the transfer stage 18 is first performed in the coarse correction mode, and next the positioning is performed in the fine correction mode.

In step S104, wafer alignment is performed. Specifically, the controller 17d acquires the position of the wafer W on the transfer stage 18, through the tester side camera 16. For example, four markers are formed on the upper surface of the wafer W. The controller 17d causes the transfer stage 18 to move, the tester side camera 16 images the markers on the wafer W, and the controller 17d acquires coordinates of the markers based on positions of the imaged markers. Note that when the tester side camera 16 images the markers on the probe card 19, positioning of the transfer stage 18 is first performed in the coarse correction mode, and next the positioning is performed in the fine correction mode.

In step S105, coordinates at which the wafer W contacts the probe card 19 are calculated. Specifically, the controller 17d calculates the coordinates at which the wafer W contacts the probe card 19, based on the position (coordinates) of the probe card 19 acquired in step S102; the position (coordinates) of the wafer W acquired in step S104; and the relationship between the tester side camera 16 and the stage side camera 54, as acquired in step S103.

In step S106, the transfer stage 18 is moved. Specifically, the controller 17d causes the transfer stage 18 on which the wafer W is mounted, to move based on the coordinates calculated in step S105. Thereby, the wafer W contacts the probe card 19.

Note that as illustrated in FIG. 2, in the substrate test apparatus 10, the transfer stages 18 (18a to 18c) are provided in the respective rows. In the normal mode, the controller 17d independently controls the transfer stages 18a to 18c in the respective rows. In this case, for example, while the process such as alignment or transfer is performed using the transfer stage 18 (for example, 18a) in one row, the process such as alignment or transfer can be performed using the other transfer stages 18 (for example, 18b and 18c) in the other rows. Thereby, the test throughput for the wafer W can be improved.

<High Precision Mode>

An example of the operation of the substrate test apparatus 10 in the high precision mode will be described. In the high precision mode as well, the wafer W contacts the probe card 19 in the process illustrated in the flowchart in FIG. 4. Further, in the high precision mode, the operation of the transfer stage 18 is constrained in comparison to the case in the normal mode. The constrained operation of the transfer stage 18 will be described with reference to the following six examples of operations.

First Operation Example

Figure 5:
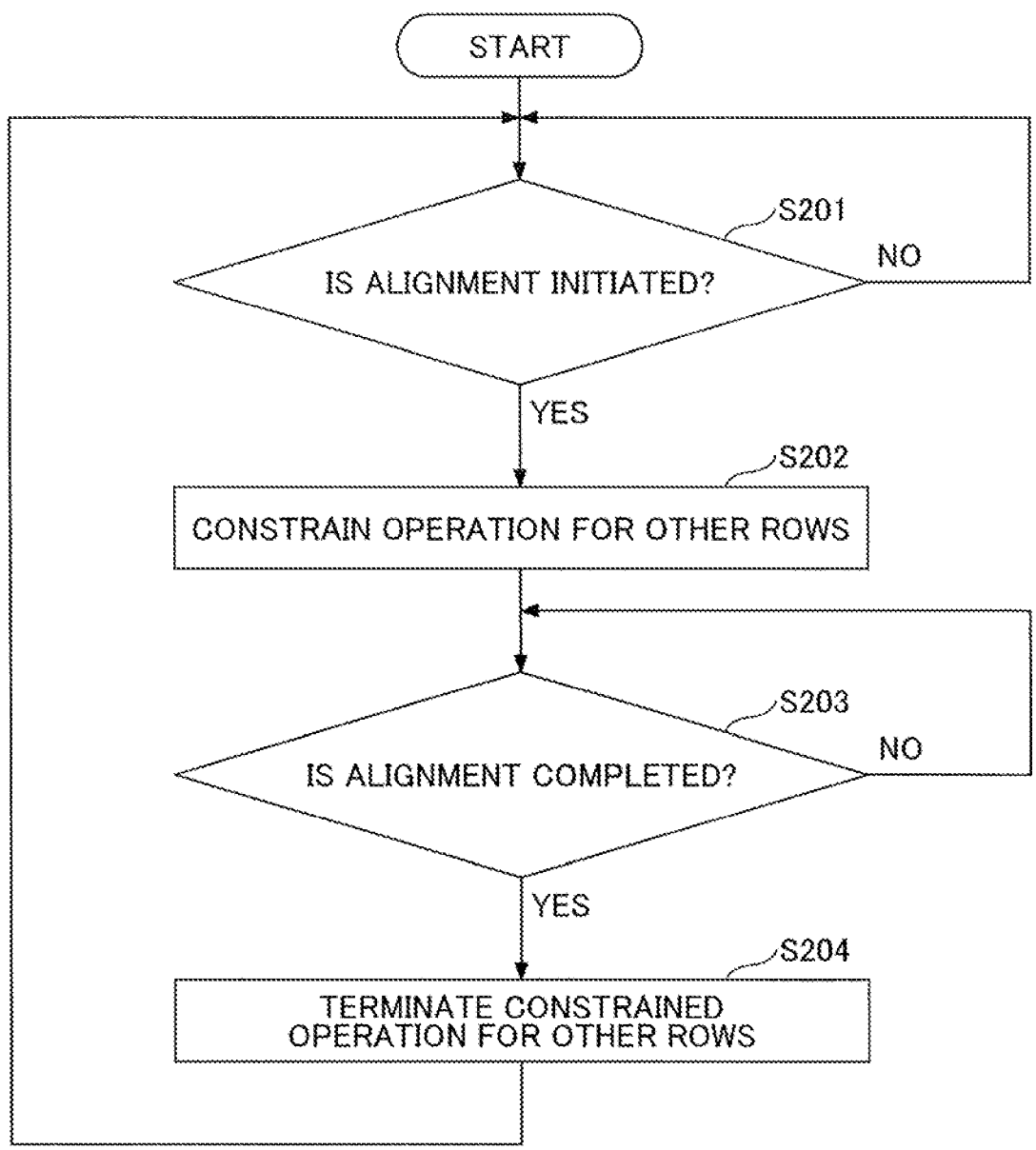
FIG. 5 is a flowchart illustrating an example of the process in a high precision mode.

The first operation example in the high precision mode will be described with reference to FIG. 5. FIG. 5 is a flowchart illustrating an example of the process in the high precision mode. Note that in the following description, an example of a case where the wafer W mounted on the transfer stage 18a contacts the probe card 19 will be described.

In step S201, the controller 17d determines whether the transfer stage 18a is during alignment. The "during alignment" covers probe alignment in step S102; alignment of the upper camera with the lower camera in step S103; and wafer alignment in step S104. When the transfer stage 18a is not during alignment (No in S201), the controller 17d repeats the process in step S201. When the transfer stage 18a is during alignment (Yes in S202), the process of the controller 17d proceeds to step S202.

In step S202, the controller 17d constrains the operation of the transfer stages 18b and 18c in the other rows. Specifically, in the first operation example, the controller 17b causes the transfer stages 18b and 18c in the other rows to remain stationary at the respective current locations of the transfer stages.

In step S203, the controller 17d determines whether alignment at the transfer stage 18a is completed. When alignment is not completed (No in S203), the controller 17d repeats the process in step S203. When alignment is completed (Yes in S203), the process of the controller 17d proceeds to step S204.

In step S204, the controller 17d terminates the constrained operation of the transfer stages 18b and 18c in the other rows. Then, the process of the controller 17d returns to step S201.

According to the first operation example in the high precision mode, during alignment of the transfer stage 18a, the transfer stages 18b and 18c in the other rows remain stationary. Thereby, the effect of vibration caused by the operation of the transfer stages 18b and 18c in the other rows is minimized, so that the transfer stage 18a can be aligned accurately. Accordingly, accuracy of the contact between the wafer W on the transfer stage 18a and the probe card 19 can be improved.

Note that during alignment of the transfer stage 18a, when the transfer stages 18b and 18c in the other rows are stationary, test throughput for the wafer W is reduced. However, alignment time is shorter than other required lengths of time (e.g., time to transfer the wafer W to the substrate test apparatus 10, time to test the wafer W, or the like). In light of the point described above, the effect of reduction in the test throughput is decreased. The effect of the reduction in the test throughput is decreased as time to test the wafer W increases.

The frame of the substrate test apparatus 10 may be strained by the weight of the transfer stages 18b and 18c. When the transfer stage 18a is aligned, in a case when locations of the transfer stages 18b and 18c vary, a state in which the frame of the substrate test apparatus 10 is strained differs accordingly. For this reason, accuracy of the contact between the wafer W and the probe card 19 may be negatively affected by the state in which the frame of the substrate test apparatus 10 is strained.

The controller 17d calculates an offset amount of the wafer W relative to the probe card 19, due to the frame strain, based on the locations (cells) at which the transfer stages 18b and 18c are stationary; and the location (cell) at which the transfer stage 18a is aligned. Subsequently, the controller 17d may correct the coordinates calculated in step S105, based on the offset amount. Thereby, accuracy of the contact between the wafer W on the transfer stage 18a and the probe card 19 can be improved.

Second Operation Example

The second operation example in the high precision mode will be described. In the first operation example described above, the operation of the transfer stages 18b and 18c in the other rows is constrained during alignment of the transfer stage 18a. In contrast, in the second operation example, the operation of the transfer stages 18b and 18c in the other rows is constrained in the fine correction mode during alignment of the transfer stage 18a. Specifically, in the second operation example, the transfer stages 18b and 18c in the other rows are stationary at the respective current locations of the transfer stages.

According to the second operation example in the high precision mode, the effect of vibration caused by the operation of the transfer stages 18b and 18c in the other rows is minimized, and thus the transfer stage 18a can be aligned accurately. Accordingly, accuracy of the contact between the wafer W on the transfer stage 18a and the probe card 19 can be improved.

Further, according to the second operation example, time to cause the transfer stages 18b and 18c in the other rows to be stationary can be decreased. Thereby, reduction in the throughput can be minimized.

Third Operation Example

The third operation example in the high precision mode will be described. In the third operation example, the operation of the transfer stages 18b and 18c in the other rows in step S202 is constrained by holding the transfer stages 18b and 18c stationary at respective home positions. Each home position is a preset position.

According to the third operation example in the high precision mode, the effect of vibration caused by the operation of the transfer stages 18b and 18c in the other stages is minimized, and thus the transfer stage 18a can be aligned accurately. Accordingly, accuracy of the contact between the wafer W and the probe card 19 can be improved.

Further, according to the third operation example, during alignment, the locations of the transfer stages 18b and 18c in the other rows are set to the respective home positions. Thereby, the effect of frame strain can become constant. Accordingly, accuracy of the contact between the wafer W on the transfer stage 18a and the probe card 19 can be further improved.

Fourth Operation Example

The fourth operation example in the high precision mode will be described. In the fourth operation example, the operation of the transfer stages 18b and 18c in the other rows in step S202 is constrained by minimizing the acceleration or deceleration of the driven transfer stages 18b and 18c. Specifically, acceleration or deceleration limits of the transfer stages 18b and 18c in the other rows, in the high precision mode, is set to be smaller than acceleration or deceleration limits of the transfer stages 18a to 18c, in the normal mode.

According to the fourth operation example in the high precision mode, the effect of vibration caused by the operation of the transfer stages 18b and 18c in the other rows is minimized, and thus the transfer stage 18a can be accurately aligned. Accordingly, accuracy of the contact between the wafer W on the transfer stage 18a and the probe card 19 can be improved.

Fifth Operation Example

The fifth operation example in the high precision mode will be described. In the fifth operation example, the operation of the transfer stages 18b and 18c in the other rows in step S202 is constrained by minimizing the acceleration or deceleration of each of the driven transfer stages 18b and 18c. Specifically, acceleration or deceleration limits of the transfer stages 18b and 18c in the other rows, in the high precision mode, are set to be smaller than acceleration or deceleration limits of the transfer stages 18a to 18c, in the normal mode. Further, for each of the transfer stages 18b and 18c in the other rows, movement between cells is prohibited.

According to the fifth operation example in the high precision mode, the effect of vibration caused by the operation of the transfer stages 18b and 18c in the other rows is minimized, and thus the transfer stage 18a can be accurately aligned. Accordingly, accuracy of the contact between the wafer W and the probe card 19 can be improved.

Further, according to the fifth operation example, by constraining the movement between cells, the effect of variation in the frame strain can be reduced. Thereby, accuracy of the contact between the wafer W on the transfer stage 18a and the probe card 19 can be further improved.

Sixth Operation Example

The sixth operation example in the high precision mode will be described. In the sixth operation example, acceleration or deceleration of each of the driven transfer stages 18a to 18c is decreased throughout in comparison to the case in the normal mode.

According to the sixth operation example in the high precision mode, the effect of vibration caused by the operation of the transfer stages 18b and 18c in the other rows is minimized, and thus the transfer stage 18a can be accurately aligned. Accordingly, accuracy of the contact between the wafer W on the transfer stage 18a and the probe card 19 can be improved.

The operation of the transfer stage 18a in the high precision mode has been described using the process illustrated in the flowchart in FIG. 4. However, such operation is not limited to the process described above. The alignment operation of the transfer stage 18a will be described with reference to the seventh operation example to the ninth operation example.

Seventh Operation Example

Figure 6:
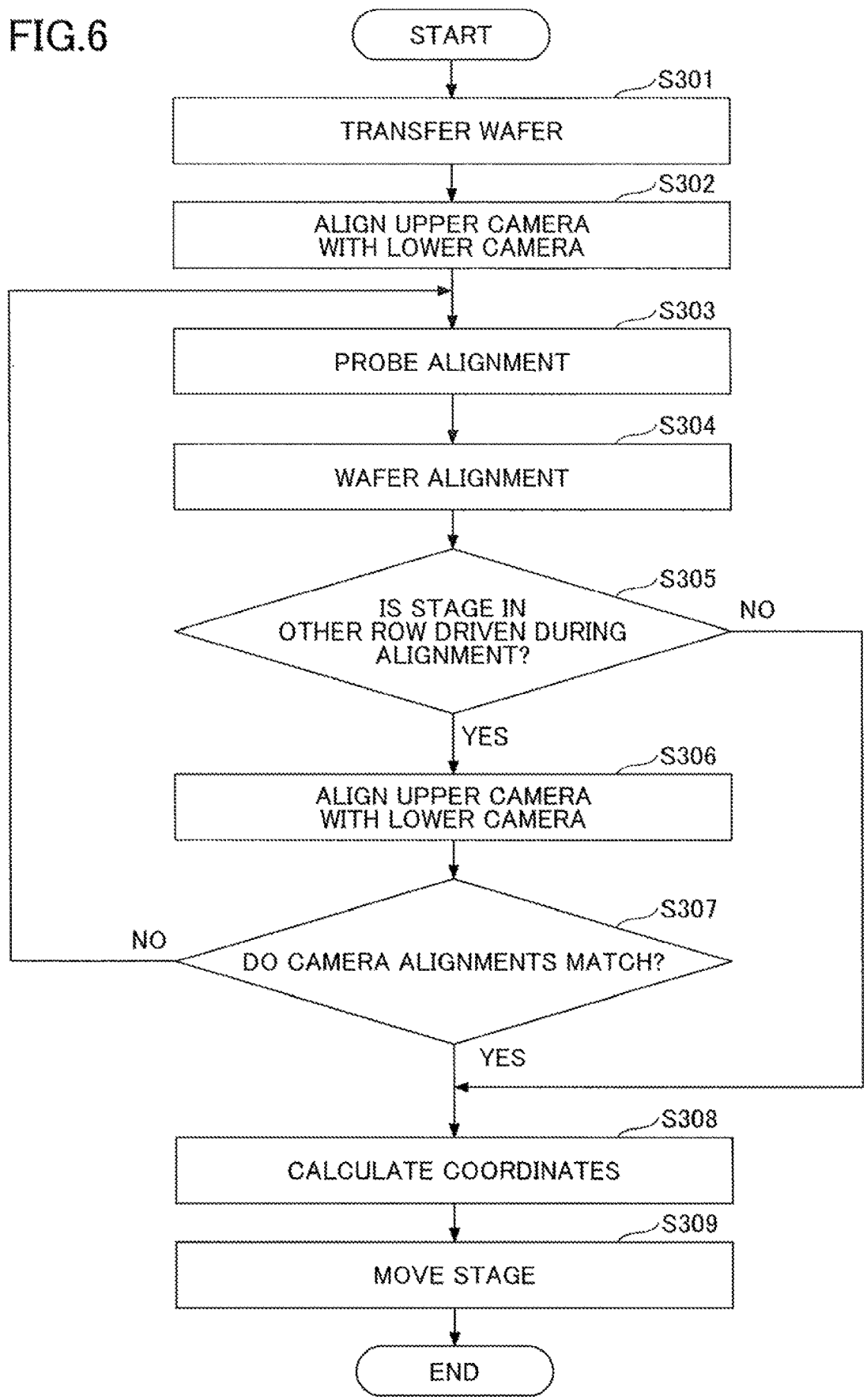
FIG. 6 is a flowchart illustrating an example of the process of contacting the wafer with the probe card, in the high precision mode.

The seventh operation example in the high precision mode will be described with reference to FIG. 6. FIG. 6 is a flowchart illustrating an example of the process of contacting the wafer W with the probe card 19, in the high precision mode.

In step S301, the wafer W is transferred, as in the case with step S101.

In step S302, the upper camera is aligned with the lower camera. Note that the alignment of the upper camera with the lower camera in step S302 is the same as the alignment of the upper camera with the lower camera in step S103.

In step S303, probe alignment is performed. Note that the probe alignment in step S303 is the same as the probe alignment in step S102.

In step S304, wafer alignment is performed. Note that the wafer alignment in step S304 is the same as the wafer alignment in step S104.

In step S305, the controller 17d determines whether at least one from among the transfer stages 18b and 18c in the other rows is driven during alignment of the transfer stage 18a. When the transfer stages 18b and 18c are not driven (No in S305), the process of the controller 17d proceeds to step S308. When at least one from among the transfer stages 18b and 18c is driven (Yes in S305), the process of the controller 17d proceeds to step S306.

In step S306, the upper camera is aligned with the lower camera again. Note that the alignment of the upper camera with the lower camera in step S306 is the same as the alignment of the upper camera with the lower camera in step S302.

In step S307, the controller 17b determines whether the alignment of the upper camera with the lower camera in step S302 matches the alignment of the upper camera with the lower camera in step S306. When the alignment in step S302 does not match the alignment in step S306 (No in S307), the process of the controller 17d returns to step S303. When the alignment in step S302 matches the alignment in step S306 (Yes in S307), the process of the controller 17d proceeds to step S308.

In step S308, coordinates at which the wafer W contacts the probe card 19 are calculated. Note that the calculation of the coordinates in step S308 is the same as the calculation of the coordinates in step S105.

In step S309, the transfer stage 18 is moved. Specifically, the controller 17d causes the transport stage 18 on which the wafer W is mounted to move based on the coordinates calculated in step S308. Thereby, the wafer W contacts the probe card 19.

According to the seventh operation example in the high precision mode, when at least one from among the transfer stages 18b and 18c in the other rows is driven during alignment of the transfer stage 18a, the upper camera is aligned with the lower camera again. Further, it is determined whether the resulting alignment matches alignment of the upper camera with the lower camera performed first. When the resulting alignment matches the first performed alignment, the contact accuracy described above can be determined to be less affected by the driving of at least one from among the transfer stages 18b and 18c in the other rows. Thereby, retries of alignment of the transfer stage 18a are reduced and thus reduction in the test throughput can be minimized. In contrast, when the resulting alignment does not match the first performed alignment, realignment is performed so that accuracy of the contact between the wafer W on the transfer stage 18a and the probe card 19 can be improved.

Eighth Operation Example

Figure 7:
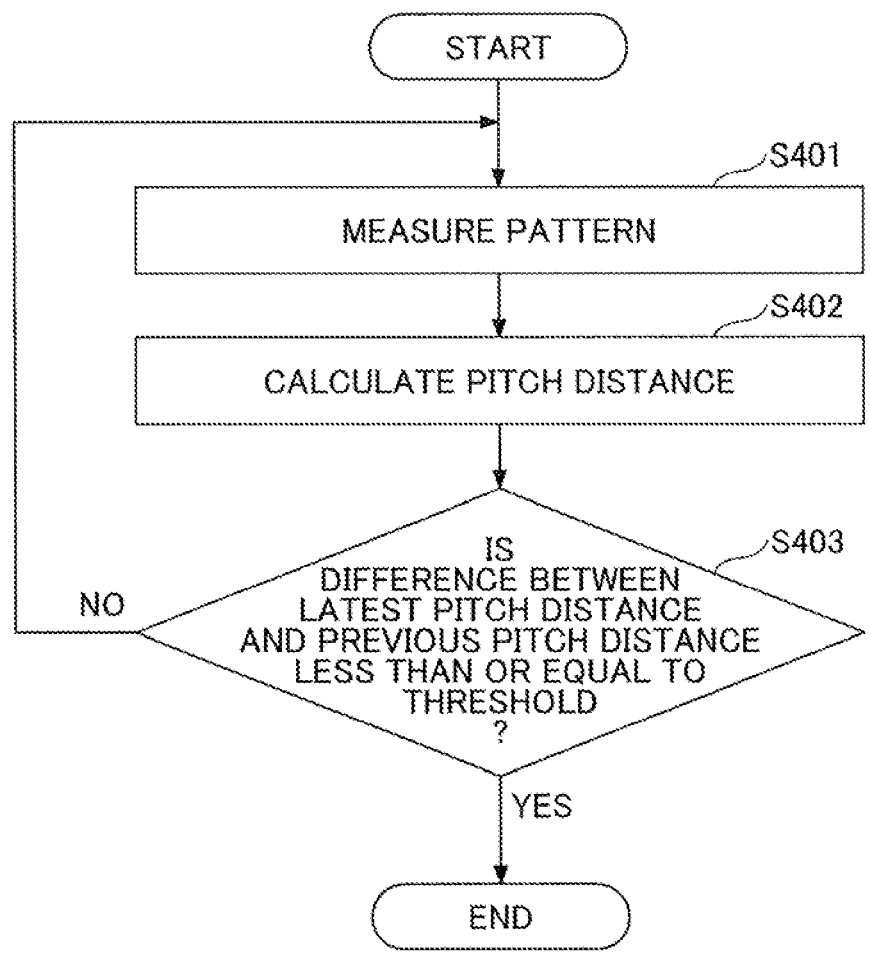
FIG. 7 is a flowchart illustrating an example of the process in the high precision mode.

The eighth operation example in the high precision mode will be described with reference to FIG. 7. FIG. 7 is a flowchart illustrating an example of the process in the high precision mode. Note that the process illustrated in FIG. 7 is performed while probe alignment (S102, S303, or the like) is performed. Such a process may be performed while wafer alignment (S104, 304, or the like) is performed.

In step S401, a pattern of the markers formed on the lower surface of the probe card 19 is measured.

In step S402, a pitch distance between markers in the pattern is calculated.

In step S403, it is determined whether a difference between the latest pitch distance calculated in step S402 and the previous pitch distance is less than or equal to a predetermined threshold. When a difference is not less than or equal to a predetermined threshold (No in S403), the process returns to step S401 and then the marker pattern is measured again. When such a difference is less than or equal to a predetermined threshold (Yes in S403), the flow illustrated in FIG. 7 is terminated.

The marker pattern on the probe card 19 does not vary. In light of the point described above, when the pitch distance for the pattern varies, the marker pattern can be assumed to have been affected by vibration or the like. Thus, the pattern is measured again. In other words, probe alignment is performed again. As a result, coordinates of the markers can be suitably detected, and thus accuracy of the contact between the wafer W and the probe card 19 can be improved.

Ninth Operation Example

Figure 8:
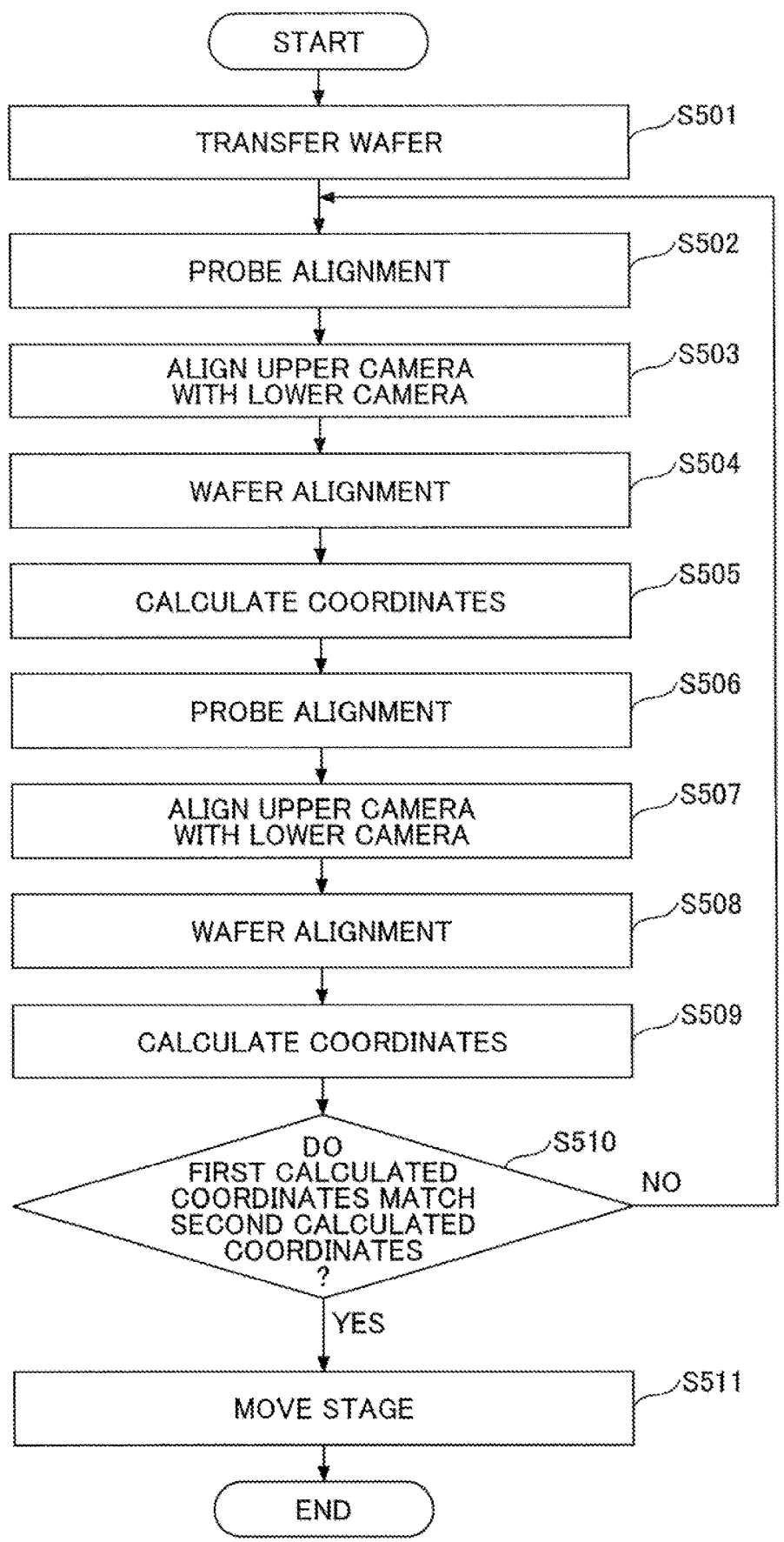
FIG. 8 is a flowchart illustrating an example of the process of contacting the wafer with the probe card, in the high precision mode.

The ninth operation example in the high precision mode will be described with reference to FIG. 8. FIG. 8 is a flowchart illustrating an example of the process of contacting the wafer W with the probe card 19, in the high precision mode.

In step S501, the wafer W is transported, as in the case with step S101.

In step S502, probe alignment is performed. In step S503, the upper camera is aligned with the lower camera. In step S504, wafer alignment is performed. In step S505, coordinates at which the wafer W contacts the probe card 19 are calculated. Note that the process described in these steps is the same as that described in steps S101 to S105 in FIG. 4.

In steps S506 to S509, the probe alignment; the alignment of the upper camera with the lower camera; the wafer alignment; and the coordinate calculation are performed as in the case with steps S502 to S505.

In step S510, the controller 17d determines whether first coordinates calculated in step S505 match second coordinates calculated in step S509. Here, matching means that a difference between the first coordinates and the second coordinates is less than or equal to a predetermined threshold. When the first coordinates do not match the second coordinates (No in S510), the process returns to step S502. When the first coordinates match the second coordinates (Yes in S510), the process of the controller 17d proceeds to step S511.

In step S511, the transfer stage 18 is moved. Specifically, the controller 17d causes the transfer stage 18 on which the wafer W is mounted to move, based on the coordinates calculated above. Thereby, the wafer W contacts the probe card 19.

According to the ninth operation example in the high precision mode, the probe alignment; the alignment of the upper camera with the lower camera; wafer alignment; and the coordinate calculation, are performed two times to determine whether the coordinates match. When the coordinates do not match, realignment is performed. As a result, the coordinates can be suitably detected, and thus accuracy of the contact between the wafer W and the probe card 19 can be improved.

The substrate test apparatus 10 has been described above, but the present disclosure is not limited to the above embodiments and the like. Various modifications and changes can be made within the scope of the present disclosure.

The driving of the transfer stages 18 described in any example from among the first operation example to the sixth operation example may be combined with the process of the redetection described in any one example from among the seventh operation example to ninth operation example.

According to one aspect of the present disclosure, a method for controlling a test apparatus and a test apparatus are provided whereby contact accuracy is improved. From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

What is claimed is:

1. A method for controlling a test apparatus that includes
a test unit in which testers are arranged in columns and rows, each tester configured to test a substrate;
aligners each configured to cause the substrate to be contacted with respect to a given tester from among the testers, at least one aligner provided in each row, and each aligner configured to move between testers in a corresponding row; and
a controller configured to control the aligners, the method comprising:
independently controlling, by the controller, the at least one aligner in each row;
constraining, by the controller, movement, between testers in a second row, of a second aligner in the second row, while alignment is performed through a first aligner in a first row different from the second row, the first aligner and the second aligner being from among the aligners.

2. The method for controlling a test apparatus according to claim 1, wherein the alignment through the first aligner is configured to perform in a coarse correction mode and a fine correction mode, and
wherein the constraining includes causing, by the controller, the second aligner to be stationary, while the alignment is performed through the first aligner, in the fine correction mode.

3. The method for controlling a test apparatus according to claim 1, wherein a home position of each aligner is set, and
wherein the constraining includes causing, by the controller, the second aligner to be stationary at the home position, while the alignment is performed through the first aligner.

4. The method for controlling a test apparatus according to claim 1, wherein the constraining includes constraining, by the controller, acceleration or deceleration of the second aligner, while the alignment is performed through the first aligner.

5. A method for controlling a test apparatus that includes
a test unit in which testers are arranged in columns and rows, each tester configured to test a substrate;
aligners each configured to cause the substrate to be contacted with respect to a given tester from among the testers, at least one aligner provided in each row; and
a controller configured to control the aligners, the method comprising:
constraining, by the controller, operation of at least a second aligner, while alignment is performed through a first aligner from among the aligners; and
performing realignment by the controller, upon detecting that an offset between a result of first camera alignment and a result of second camera alignment is greater than a predetermined value, the first camera alignment and the second camera alignment being each alignment associated with a first camera and a second camera,
wherein the alignment includes:
the first camera alignment in which an axis of the first camera is aligned with an axis of the second camera;
probe alignment in which a position of a probe card is detected via the second camera;
substrate alignment in which a position of the substrate is detected via the first camera; and
the second camera alignment in which the axis of the first camera is aligned with the axis of the second camera.

6. A method for controlling a test apparatus that includes
a test unit in which testers are arranged in columns and rows, each tester configured to test a substrate;
aligners each configured to cause the substrate to be contacted with respect to a given tester from among the testers, at least one aligner provided in each row; and
a controller configured to control the aligners, the method comprising:
constraining, by the controller, operation of at least a second aligner, while alignment is performed through a first aligner from among the aligners, wherein in the alignment,
a position of a pattern formed on a detected object is detected to calculate a pitch distance in the pattern based on the detected position, and
realignment is performed upon detecting that an offset between the calculated pitch distance and a stored pitch distance immediately preceding the calculated pitch distance is greater than a predetermined value.

7. A test apparatus comprising:
a test unit in which testers are arranged in columns and rows, each tester configured to test a substrate;
aligners each configured to cause the substrate to be contacted with respect to a given tester from among the testers, at least one aligner provided in each row, and each aligner configured to move between testers in a corresponding column; and
a controller configured to
independently control the at least one aligner in each row
constrain movement, between the testers in a second row, of a second aligner in the second row, while alignment is performed through a first aligner in a first row different from the second row, the first aligner and the second aligner being from among the aligners.

* * * * *